United States Patent
Hoepfner

(10) Patent No.: US 6,645,855 B2
(45) Date of Patent: Nov. 11, 2003

(54) METHOD FOR FABRICATING AN INTEGRATED SEMICONDUCTOR PRODUCT

(75) Inventor: Joachim Hoepfner, Planegg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/995,210

(22) Filed: Nov. 27, 2001

(65) Prior Publication Data

US 2002/0064960 A1 May 30, 2002

(30) Foreign Application Priority Data

Nov. 27, 2000 (DE) .......................................... 100 58 886

(51) Int. Cl.⁷ ............................................. H01L 21/44
(52) U.S. Cl. ........................... 438/666; 438/50; 438/53; 438/648; 438/622; 438/8; 438/637; 438/625; 438/506; 438/419
(58) Field of Search .......................... 438/50, 53, 648, 438/622, 8, 637, 625, 3, 666; 257/506, 419, 513, 417

(56) References Cited

U.S. PATENT DOCUMENTS

| | | | |
|---|---|---|---|
| 4,560,435 A | * 12/1985 | Brown et al. ................. 216/40 |
| 5,335,138 A | 8/1994 | Sandhu et al. |
| 5,401,680 A | 3/1995 | Abt et al. |
| 5,647,952 A | * 7/1997 | Chen ............................. 438/8 |
| 5,863,835 A | * 1/1999 | Yoo et al. ................... 438/666 |
| 5,880,509 A | * 3/1999 | Watanabe et al. ........... 257/419 |
| 6,010,927 A | 1/2000 | Jones, Jr. et al. |
| 6,080,675 A | 6/2000 | Prall et al. |
| 6,130,467 A | * 10/2000 | Bandyopadhyay et al. . 257/506 |
| 6,245,663 B1 | * 6/2001 | Zhao et al. .................. 438/622 |
| 6,245,672 B1 | * 6/2001 | Hong et al. ................. 438/648 |
| 6,265,305 B1 | * 7/2001 | Tsou et al. .................. 438/628 |
| 6,388,252 B1 | * 5/2002 | Takahashi et al. .......... 250/306 |

FOREIGN PATENT DOCUMENTS

DE   196 40 246 A 1   4/1998

* cited by examiner

*Primary Examiner*—Caridad Everhart
*Assistant Examiner*—V. Yevsikov
(74) *Attorney, Agent, or Firm*—Laurence A. Greenberg; Werner H. Stemer; Gregory L. Mayback

(57) ABSTRACT

A method fabricates an integrated semiconductor product. The first step is providing a semiconductor wafer that has preformed semiconductor components. The next step is forming at least one connection, in particular a polysilicon connection. The next step is exposing the at least one connection from the wafer front surface. The next step is applying a protective layer, in particular a silicon nitride protective layer, to the wafer front surface. The next step is treating the wafer front surface by a chemical mechanical polishing (CMP) step, with the result that the at least one connection is made accessible again.

23 Claims, 3 Drawing Sheets

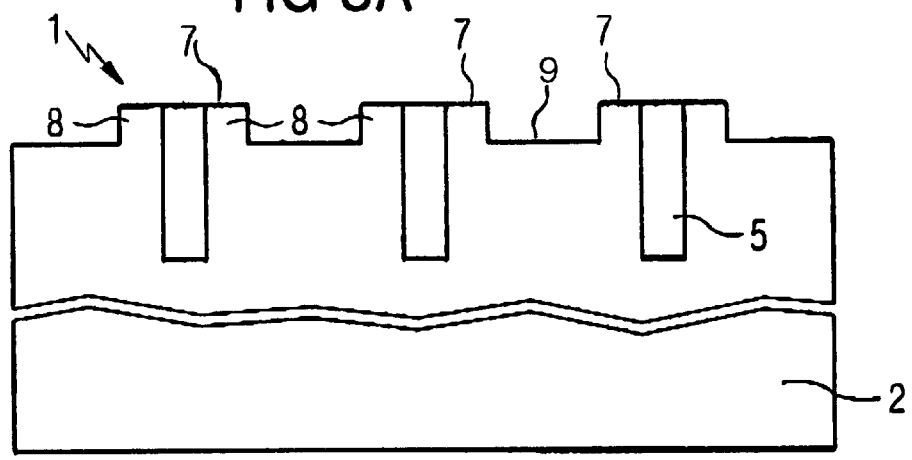
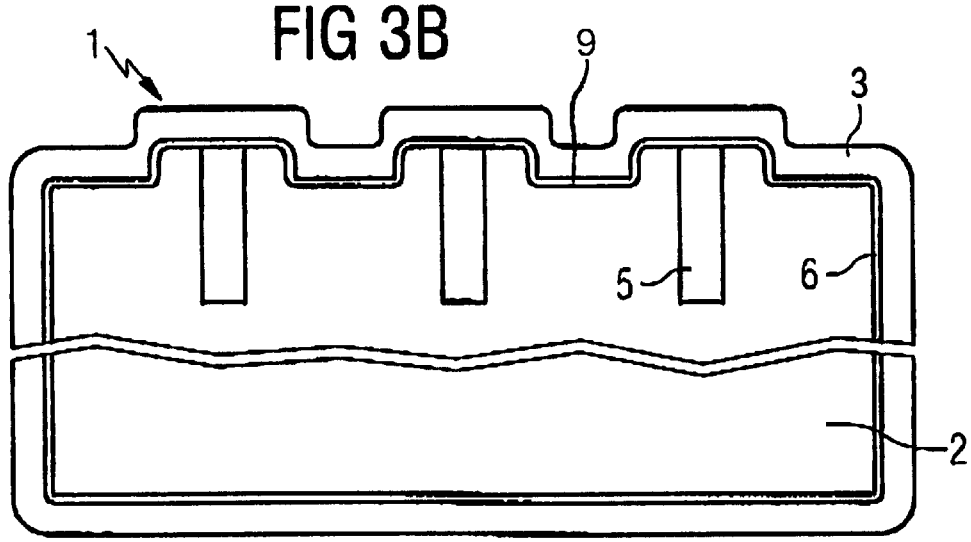
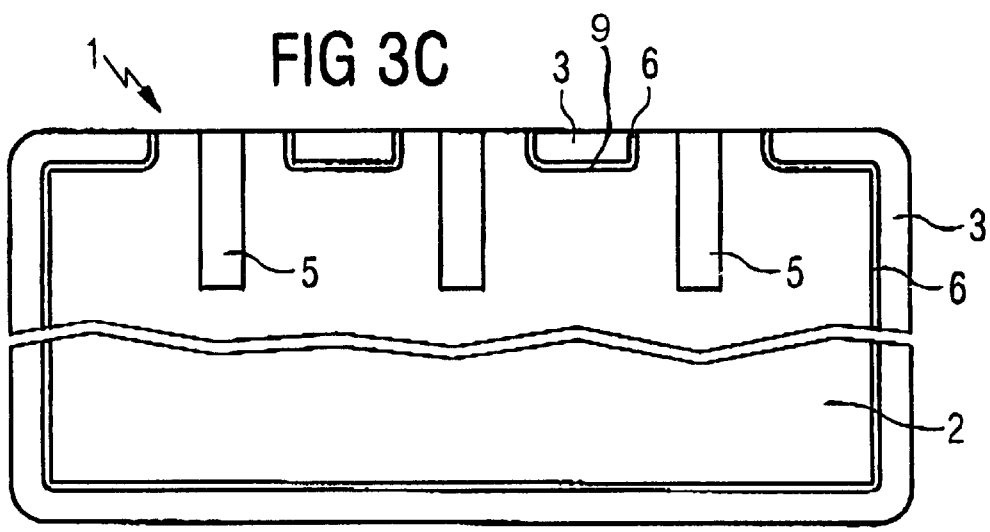

METHOD FOR FABRICATING AN INTEGRATED SEMICONDUCTOR PRODUCT

BACKGROUND OF THE INVENTION

1. Field of the Invention

The invention relates to a method for fabricating an integrated semiconductor product, in particular to a method for fabricating an integrated semiconductor memory.

When fabricating nonvolatile memories, known as FeRAMs or DRAMs with high-ε materials, ferromagnetic materials, such as $Pb(ZrTi)O_3$ (PZT), strontium bismuth tantalate (SBT), or barium strontium titanate (BST), are used for the "dielectric" of the capacitors. These materials are deposited between two platinum electrodes. The deposition may take place using metal organic deposition (MOD), using metal organic chemical vapor deposition (MOCVD), or using a sputtering process. The ferroelectric storage capacitors are produced at a time at which in general the select transistors in the memory cells and the logic transistors in the periphery of the memory component have already been completely fabricated.

All the ferroelectric layers still must be "conditioned" after the deposition, which is achieved, for example, by tempering for one hour at approximately 600° to 800° C. in oxygen. During this conditioning step, by way of example, bismuth, barium, and strontium diffuse through the platinum electrode and the oxide layers below. At these temperatures, platinum also diffuses into/through the surrounding oxide and through the polysilicon connection below.

Barrier layers that are applied to the polysilicon plug (titanium nitride, tantalum nitride, iridium, iridium oxide, molybdenum silicide, etc.) are intended to prevent the polysilicon connection from being contaminated or even, under extreme circumstances, the formation of platinum silicide. Furthermore, silicon can be counterdoped by platinum or an introduced doping can be greatly reduced.

If platinum diffuses into the bulk silicon, the service life of the corresponding components can be reduced by orders of magnitude. Relatively high levels of platinum impurities (i.e. impurities of more than $10^{14}$ at/$cm^2$), may lead to total failure of the transistors that have already been produced. As well as process-related contamination, cross-contamination caused by the equipment itself (vacuum forceps, support plates, chucks, plasma processors, etc.) also occurs and contaminates the wafer back surface to the extent of >>5× $10^{12}$ at/$cm^2$. It is known from the literature that even minor contamination in the region of $10^{13}$ at/$cm^2$, which corresponds to $10^{14}$ at/$cm^3$ for a wafer thickness of 1 mm, has a targeted influence on the electrical properties of components.

Because platinum very quickly diffuses interstitially at temperatures of less than 500° C. but can only become electrically active if there are "holes" in the silicon, the contamination is in actual fact greater than that which can be determined indirectly by electrical measurements. Since "holes" occur close to the surface, a "well profile" is measured through the wafer thickness, with considerably higher concentrations of platinum toward the surfaces. The platinum that is not yet electrically active acts as source from which platinum can "rediffuse" even at temperatures below 500° C.

In addition, the problem arises during manufacture that the wafer back surfaces are exposed during the build-up of the capacitors; therefore, all elements can pass directly or indirectly onto/into the silicon surface. Wafers with slight back-surface damage are used in the ferro process. This damage layer may take up approximately one order of magnitude of the contamination.

Complex attempts at cleaning on silicon wafers with controlled contamination (spin-on solutions) have shown that, in particular, platinum can no longer be removed from the silicon surface. What occurs is a type of further accumulation. On silicon wafers with controlled contamination, after removal of up to 5 μm of silicon it was always possible to measure the same contamination level of >$3×10^{12}$ at/$cm^2$ of platinum. Even complex-forming agents admixed with the etching solutions did not achieve the desired result.

Wet cleaning steps could remove all the other elements listed above. Accordingly, the levels of these elements were reduced to the detection limit. Iridium, which is next to platinum in the periodic system, is also difficult to remove. It is highly soluble in silicon oxide but diffuses more slowly than platinum in silicon, particularly at relatively low temperatures.

The contamination to the wafer back surface has hitherto been limited by using a nitride cap on the wafer back surface. FIG. 1A shows an integrated semiconductor product 1 in which a silicon nitride layer or cap 3 has been applied to the back surface of the silicon wafer 2. The nitride cap 3, which also forms on the wafer front surface 9 on account of process conditions, must be etched off the wafer front surface 9 again. This causes considerable thinning of the nitride cap 3 on the wafer edge 4. FIG. 1B shows the back surface cap 3 after an etching step for removal of the cap on the front surface. After an etching step has been completed, the wafer edge 4 is exposed. FIG. 1C shows that further thinning/drawing back of the protective layer occurs after a plurality of etching steps. Consequently, an increasingly large Si wafer edge region 4 is exposed.

When using other silicon nitride back-etching installations (e.g. the LAM tool), although it is possible to considerably improve the thinning of the cap 3 on the wafer edge 4, the silicon wafer edge 4 is nevertheless exposed again after a plurality of back-surface cleaning steps using $HF/HNO_3$. As described above, at this location platinum can accumulate/diffuse in and cause considerable damage to the components that have already been produced, for example transistors, on the wafer front surface.

SUMMARY OF THE INVENTION

It is accordingly an object of the invention to provide a method for fabricating an integrated semiconductor product that overcomes the hereinafore-mentioned disadvantages of the heretofore-known devices of this general type and that reduces the contamination of the wafer back surface or eliminates it altogether.

With the foregoing and other objects in view, there is provided, in accordance with the invention, a method for fabricating an integrated semiconductor product. The first step is providing a semiconductor wafer that has previously-produced semiconductor components. The next step is forming at least one connection, in particular a polysilicon connection. The next step is exposing the at least one connection from the wafer front surface. The next step is applying a protective layer, in particular a silicon nitride protective layer, to the wafer surface. The next step is treating the wafer front surface with a chemical mechanical polishing (CMP) step, with the result that the at least one connection is made accessible again.

Therefore, after the deposition of the protective layer, all that remains is for a CMP step to be conducted on the wafer front surface. This step does not cause any change to the nitride cap on the wafer edge. This concluding CMP step avoids the need to etch the wafer front surface until it is clear. As a result, the nitride cap is not thinned at the wafer edge. Therefore, the wafer back surface remains protected against contamination in subsequent steps.

In the method according to the invention, prior to the deposition of the protective layer (protective layer sheathing) on the wafer front surface, the connections, in particular the polysilicon plug connections, are exposed. According to a preferred embodiment, back-etching of the wafer surface exposes the connections. In this case, preferably a silicon oxide layer of the wafer surface is back-etched between the polysilicon connections. This back-etching of the wafer surface can in principle be effected using all fluoride-containing, acidic etching mixtures. According to a preferred embodiment, the back-etching is effected by dilute hydrofluoric acid or BHF. Silicon of any type is very soluble in these acidic, fluoride-containing etching agents.

According to a further, particularly preferred embodiment of the present invention, the back-etching of the wafer surface can take place with the aid of a resist mask, with the connections being covered by the resist mask. According to a particularly preferred embodiment, plasma etching accomplishes the back-etching.

Preferably, the at least one connection is exposed to project 25 to 400 nm, in particular 50 to 300 nm, beyond the wafer surface in the etching step. Most preferably, the at least one connection is exposed to project 75 to 200 nm, in particular 100 to 150 nm, beyond the wafer surface.

On account of process conditions, the surrounding silicon oxide is completely or almost completely removed from the connections during wet-chemical etching of the wafer surface. When using a resist mask and back-etching by plasma etching, small quantities of the silicon oxide surrounding the connections are generally retained because the resist mask cannot be precisely positioned only above the connections. Therefore, the region covered by the resist mask is always made slightly larger than would actually be necessary for complete coverage of the connections.

After the connections have been exposed, a protective layer, in particular a silicon nitride protective layer, is applied to the entire wafer surface. Preferably, this protective layer is applied in a thickness between 40 and 250 nm, in particular in a thickness of between 60 and 175 nm. A particularly advantageous thickness of the protective layer to be applied is between 80 and 125 nm, in particular in a thickness of approximately 100 nm.

The protective layer is preferably applied by low-pressure chemical vapor deposition (LPCVD). In a particularly advantageous embodiment formed using LPCVD, the protective layer used is a silicon nitride layer and the Si source used is tetraethyl orthosilicate (TEOS).

According to a further preferred embodiment of the present invention, a silicon oxide layer is applied to the wafer surface after the exposure of the polysilicon connections and before the application of the silicon nitride layer. The application of the nitride cap to a silicon oxide layer advantageously avoids the usual stress of silicon nitride on silicon.

According to a preferred embodiment of the present invention, the silicon oxide layer is applied in a thickness between 25 and 150 nm, in particular in a thickness between 35 and 100 nm. It has proven particularly advantageous for the silicon oxide layer to be applied in a thickness between 50 and 80 nm, in particular in a thickness of approximately 65 nm.

The silicon oxide layer is applied using low-pressure chemical vapor deposition (LPCVD). In a preferred embodiment using LPCVD, tetraethyl orthosilicate (TEOS) is used as the Si source.

A cap protective layer thickness of approximately 165 nm has proven particularly advantageous: the silicon oxide layer being approximately 65 nm thick and the silicon nitride layer being approximately 100 nm thick. In this case, the polysilicon connections are exposed to such an extent that they project 100 to 150 nm beyond the wafer surface.

Other features that are considered as characteristic for the invention are set forth in the appended claims.

Although the invention is illustrated and described herein as embodied in a method for fabricating an integrated semiconductor product, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3A is a sectional view showing an integrated semiconductor product with polysilicon plugs that are covered by a resist mask 7;

FIG. 3B is a sectional view showing the integrated semiconductor product after removal of the resist mask, with a silicon oxide layer and a silicon nitride layer; and FIG. 3C is a sectional view showing the integrated semiconductor product after a CMP step that has exposed the polysilicon plugs again.

DESCRIPTION OF THE PREFERRED EMBODIMENTS

Figure 1A:
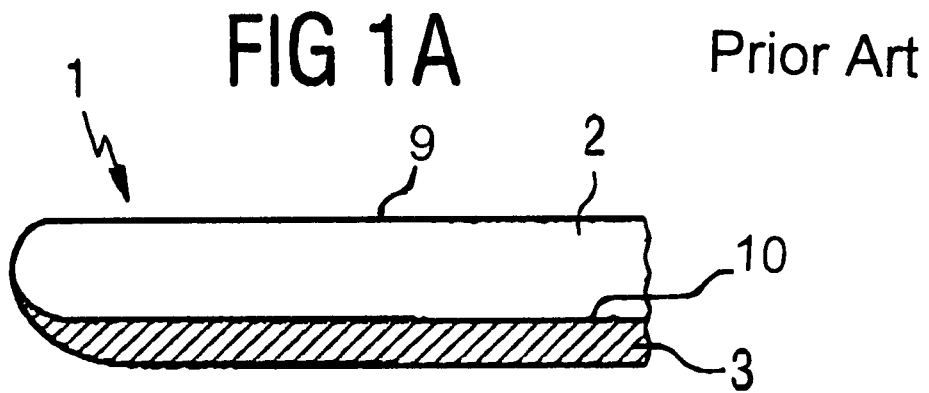
FIG. 1A is a sectional view showing a prior-art integrated semiconductor product.
Figure 1B:
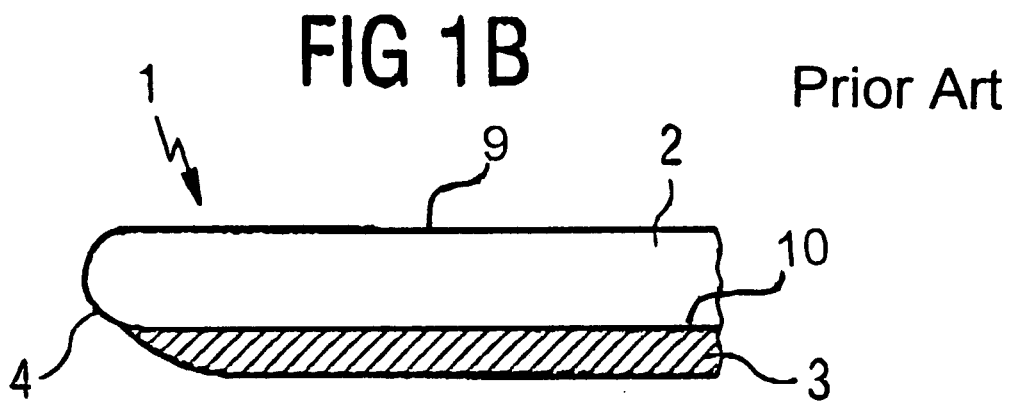
FIG. 1B is a sectional view showing the prior-art integrated semiconductor product after an etching step for the removal of the front-surface nitride cap.
Figure 1C:
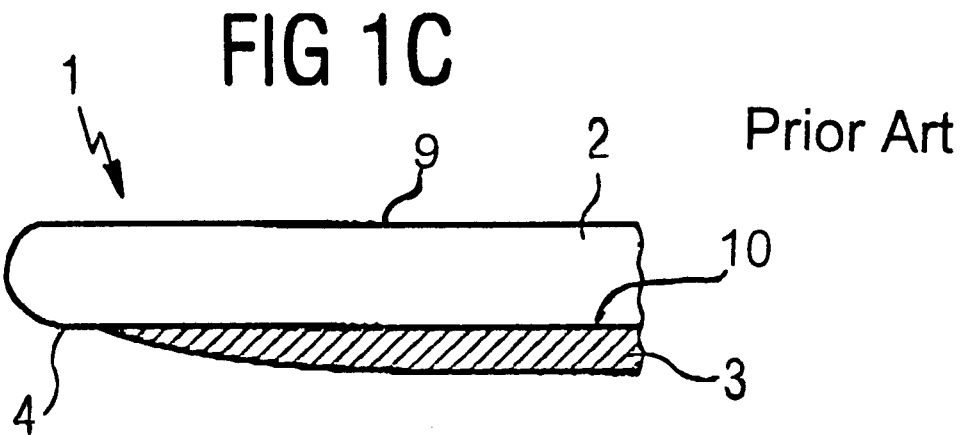
FIG. 1C is a sectional view showing the prior-art integrated semiconductor product after a plurality of etching steps.

Referring now to the figures of the drawings in detail and first, particularly to FIGS. 1A to 1C thereof, there is shown an integrated semiconductor product that is known from the prior art.

FIG. 1A shows an integrated semiconductor product 1 in which a protective layer, preferably a silicon nitride cap 3, has been applied to the back surface 10 of the silicon wafer 2. The nitride cap 3, which because of process conditions also forms on the wafer front surface 9, must be etched off the wafer front surface again. This causes considerable thinning of the nitride cap 3 on the wafer edge 4.

FIG. 1B shows the nitride cap 3 after an etching step used to remove the cap on the front surface. The wafer edge 4 is exposed after an etching step has been completed.

FIG. 1C shows that further thinning/drawing back of the protective layer occurs after a plurality of etching steps. As a result, an increasingly large Si wafer edge region 4 is clear and is then exposed to considerable contamination in subsequent process steps.

Figure 2A:
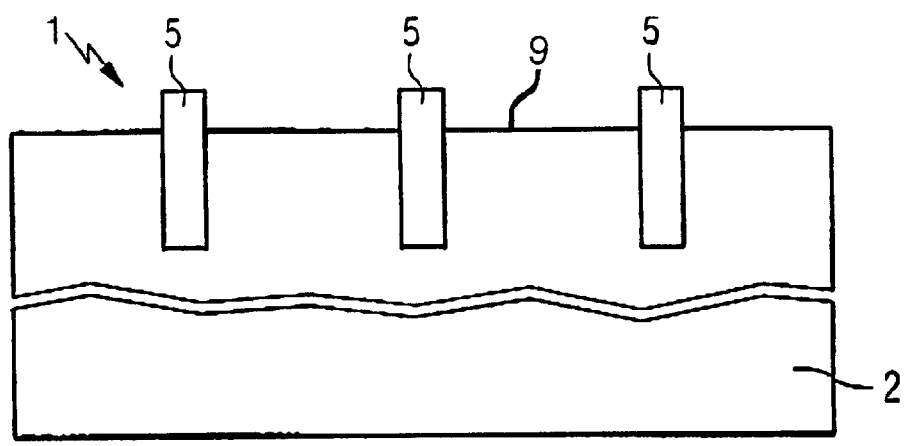
FIG. 2A is a sectional view showing an integrated semiconductor product with exposed polysilicon plugs.
Figure 2B:
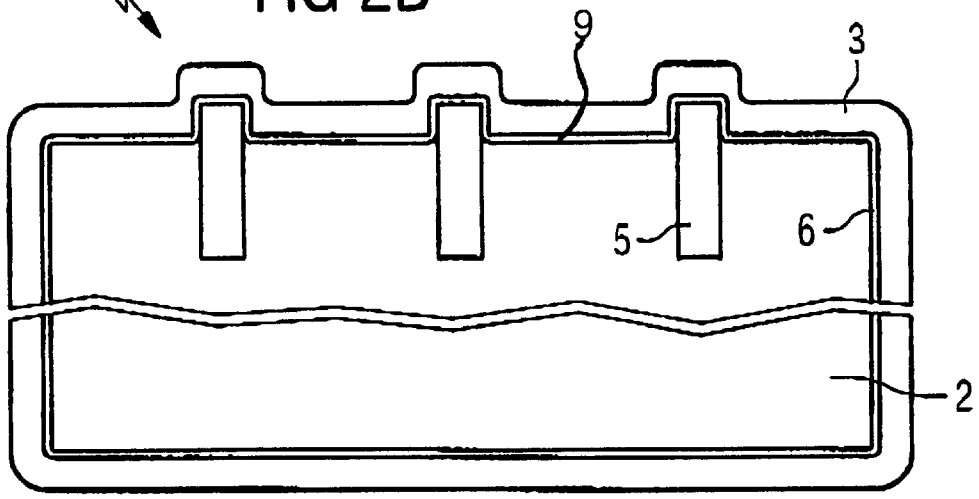
FIG. 2B is a sectional view showing the integrated semiconductor product with a silicon oxide layer and a silicon nitride layer.
Figure 2C:
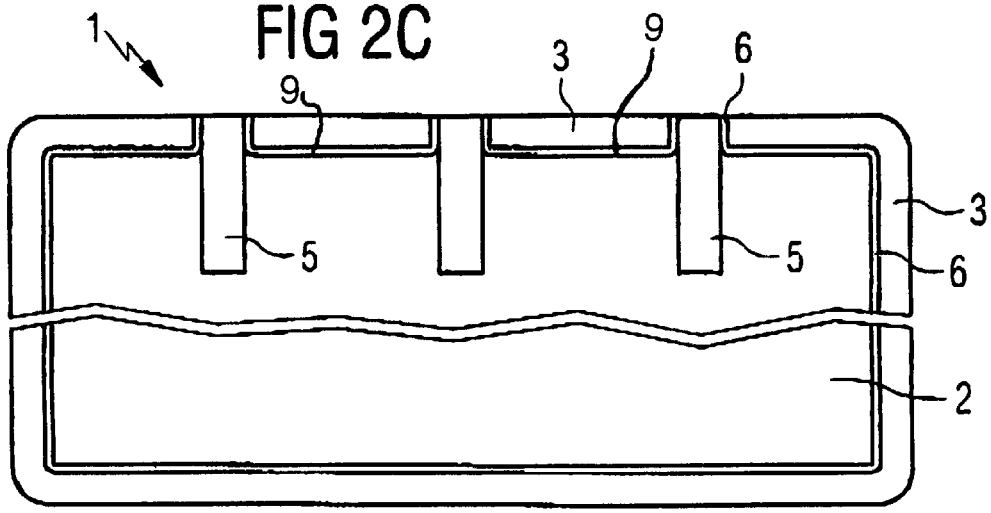
FIG. 2C is a sectional view showing the integrated semiconductor product after a CMP step exposing the polysilicon plugs again.

FIGS. 2A to 2C show an integrated semiconductor product that has been fabricated in accordance with a preferred embodiment of the present invention.

FIG. 2A shows an integrated semiconductor product 1 with polysilicon plugs 5 that have been exposed by wet-chemical etching. The polysilicon plugs 5 project 100 to 150 nm beyond the semiconductor wafer 2, which is preferably a silicon wafer 2. The polysilicon plugs 5 serve as connections to select transistors (not shown) that have already been completed and are disposed on the surface of the semiconductor substrate.

FIG. 2B shows the integrated semiconductor product illustrated in FIG. 2A with a silicon oxide layer 6 that is approximately 65 nm thick and a silicon nitride protective layer 3 that is approximately 100 nm thick.

FIG. 2C shows the integrated semiconductor product illustrated in FIG. 2B after a CMP step, which exposes the polysilicon plugs 5 again. The CMP step stops at the large-area silicon nitride layer 3 between the polysilicon plugs 5.

FIGS. 3A to 3C show an integrated semiconductor product that has been fabricated in accordance with a further preferred embodiment of the present invention.

FIG. 3A shows an integrated semiconductor product 1 with polysilicon plugs 5 that are covered by a resist mask 7. The polysilicon plugs 5 once again serve as connections to select transistors (not shown) that have already been completed and are disposed on the surface of the semiconductor substrate. Because it is not possible to precisely position the resist mask 7 only above the polysilicon connections 5, the region that is covered by the resist mask is made slightly larger than would actually be necessary for complete coverage of the polysilicon connections 5. After the back-etching of the silicon oxide layer 6 on the wafer front surface 9 by plasma etching, small quantities of the silicon oxide 8 surrounding the polysilicon plugs 5 are retained.

FIG. 3B shows the integrated semiconductor product illustrated in FIG. 3A with a silicon oxide layer 6 that is approximately 65 nm thick and a silicon nitride layer 3 which is approximately 100 nm thick.

FIG. 3C shows the integrated semiconductor product illustrated in FIG. 3B after a CMP step that reexposes the polysilicon plugs 5. The CMP step stops at the large-area silicon nitride layer 3 between the polysilicon plugs.

I claim:

1. A method for fabricating an integrated semiconductor product, which comprises:
    providing a semiconductor wafer with preformed semiconductor components and a front surface;
    forming a connection on the wafer;
    exposing the connection on the wafer front surface;
    applying a protective layer to the wafer front surface; and
    chemical mechanical polishing the wafer front surface to make the connection accessible.

2. The method according to claim 1, which further comprises exposing the connection by back-etching of the wafer front surface.

3. The method according to claim 2, which further comprises back-etching of the wafer front surface with dilute hydrofluoric acid.

4. The method according to claim 2, which further comprises back-etching the wafer front surface with BHF.

5. The method according to claim 2, which further comprises:
    covering the connection with a resist mask; and
    back-etching the wafer front surface with the resist mask.

6. The method according to claim 5, which further comprises back-etching of the wafer front surface by plasma etching.

7. The method according to claim 1, which further comprises exposing the connection between 25 and 400 nm beyond the wafer front surface.

8. The method according to claim 1, which further comprises exposing the connection between 50 and 300 nm beyond the wafer front surface.

9. The method according to claim 1, which further comprises exposing the connection between 75 and 200 nm beyond the wafer front surface.

10. The method according to claim 1, which further comprises exposing the connection between 100 and 150 nm beyond the wafer front surface.

11. The method according to claim 1, which further comprises thickening the protective layer to a thickness between 40 and 250 nm.

12. The method according to claim 1, which further comprises thickening the protective layer to a thickness between 60 and 175 nm.

13. The method according to claim 1, which further comprises thickening the protective layer to a thickness between 80 and 125 nm.

14. The method according to claim 1, which further comprises thickening the protective layer to a thickness approximately 100 nm.

15. The method according to claim 1, which further comprises applying the protective layer by low-pressure chemical vapor deposition (LPCVD).

16. The method according to claim 1, which further comprises:
    using a silicon nitride layer as the protective layer; and
    using tetraethyl orthosilicate (TEOS) as a source of Si for the silicon nitride layer.

17. The method according to claim 1, which further comprises, after forming the connection and before exposing the connection, applying a silicon oxide layer to the wafer front surface.

18. The method as claimed in claim 17, which further comprises applying the silicon oxide layer in a thickness between 25 and 150 nm.

19. The method according to claim 17, which further comprises applying the silicon oxide layer in a thickness between 35 and 100 nm.

20. The method according to claim 17, which further comprises applying the silicon oxide layer in a thickness between 50 and 80 nm.

21. The method according to claim 17, which further comprises applying the silicon oxide layer in a thickness of approximately 65 nm.

22. The method according to claim 17, which further comprises applying the silicon oxide layer by low-pressure chemical vapor deposition (LPCVD).

23. The method according to claims 17, which further comprises using tetraethyl orthosilicate (TEOS) as a Si source used when applying the silicon oxide layer.

* * * * *